United States Patent [19]
Micka et al.

[11] Patent Number: 5,592,618
[45] Date of Patent: Jan. 7, 1997

[54] REMOTE COPY SECONDARY DATA COPY VALIDATION-AUDIT FUNCTION

[75] Inventors: William F. Micka, Tucson, Ariz.; Claus W. Mikkelsen, San Jose, Calif.; Robert W. Shomler, Morgan Hill, Calif.; May N. Wone, San Jose, Calif.

[73] Assignee: International Business Machines Corporation, Armonk, N.Y.

[21] Appl. No.: 317,632

[22] Filed: Oct. 3, 1994

[51] Int. Cl.$^6$ ................................................. G06F 11/00
[52] U.S. Cl. ................ 395/185.07; 395/185.05; 395/489
[58] Field of Search ............... 395/575, 182.03, 395/182.04, 182.13, 185.07, 489, 185.05; 371/10.1, 10.2, 67.1

[56] References Cited

U.S. PATENT DOCUMENTS

| | | | |
|---|---|---|---|
| 4,897,781 | 1/1990 | Chang et al. | 364/200 |
| 4,907,228 | 3/1990 | Bruckert et al. | 371/68.3 |
| 5,052,887 | 9/1991 | Berger et al. | 364/200 |
| 5,055,999 | 10/1991 | Frank et al. | 364/200 |
| 5,138,710 | 8/1992 | Kruesi et al. | 371/10.1 |
| 5,155,845 | 10/1992 | Beal et al. | 395/575 |
| 5,195,100 | 3/1993 | Katz et al. | 371/66 |
| 5,239,637 | 8/1993 | Davis et al. | 371/67.1 |
| 5,255,270 | 10/1993 | Yanai et al. | 371/10.2 |
| 5,274,645 | 12/1993 | Idleman et al. | 371/10.1 |
| 5,446,871 | 8/1995 | Shomler et al. | 395/180 |

OTHER PUBLICATIONS

Molina et al, "Issues in Disaster Recovery" Compcon, 1990, IEEE Computer Society Int'l Conference, pp. 573–576.

Lyon et al, "Tandem's Remote Data Facility", Compcon, 1990, IEEE Computer Society Int'l Conference, pp. 562–567.

*Primary Examiner*—Robert W. Beausoliel, Jr.
*Assistant Examiner*—Joseph E. Palys
*Attorney, Agent, or Firm*—Floyd E. Anderson; Robert M. Sullivan

[57] ABSTRACT

A data copy validation technique compares primary data to a copy of that data by generating check codes of the data to be validated at both primary and secondary sites in a continuously running remote data shadowing system. The validation session runs concurrently with the data shadowing so as not to disrupt the data shadowing. Each data validation session is assigned a copy start time, for example, a time preceding a time of a consistency group, for defining when the check code for data at the primary should be compared to a check code of the data at the secondary. The check code of the data at the secondary site is taken at a time that is the equivalent logical point-in-time of that data at the primary site even though the respective data contents may be different in real time.

22 Claims, 10 Drawing Sheets

FIG. 6

| PHYSICAL CONTROL-LER ID | OPERA-TIONAL TIME STAMP | TIME INT GROUP # | READ RECORD SET TIME OF UPDATE/CONTROLLER | | |
|---|---|---|---|---|---|
| | | | SEQ. 1 OF 3 | SEQ. 2 OF 3 | SEQ. 3 OF 3 |
| SSID1 | $T_1$ | $G_1$ | 11:59 ② | 12:00 ⑤ | 12:01 ⑥ |
| SSID2 | $T_1$ | $G_1$ | 12:00 ④ | 12:02 ⑦ * | — |
| SSID3 | $T_1$ | $G_1$ | 11:58 ① | 11:59 ③ | 12:02 ⑧ * |
| SSID1 | $T_2$ | $G_2$ | | | |
| SSID2 | $T_2$ | $G_2$ | | | |
| SSID3 | $T_2$ | $G_2$ | | | |
| | $T_3$ | $G_3$ | | | |

CONSISTENCY GROUP #1

① 11:58    EARLIEST OPERATION TIME $T_1$,
② 11:59    EARLIEST TIME OF UPDATE ACROSS SSID,
③ 11:59    ORDERED IN READ SEQUENCE
④ 12:00
⑤ 12:00
⑥ 12:01    MIN TIME OF THE MAX TIMES
            OF UPDATE ACROSS ALL SSIDS

CONSISTENCY GROUP #2

⑦ ----
⑧ ----

REMOTE COPY SECONDARY DATA COPY VALIDATION-AUDIT FUNCTION

FIELD OF THE INVENTION

The present invention relates generally to disaster recovery techniques, and more particularly, to a system for real-time remote copying of direct access storage device (DASD) data with non-disruptive copy validation.

BACKGROUND OF THE INVENTION

Data processing systems, in conjunction with processing data, typically are required to store large amounts of data (or records), which data can be efficiently accessed, modified, and re-stored. Data storage is typically separated into several different levels, or hierarchically, in order to provide efficient and cost effective data storage. A first, or highest level of data storage involves electronic memory, usually dynamic or static random access memory (DRAM or SRAM). Electronic memories take the form of semiconductor integrated circuits wherein millions of bytes of data can be stored on each circuit, with access to such bytes of data measured in nano-seconds. The electronic memory provides the fastest access to data since access is entirely electronic.

A second level of data storage usually involves direct access storage devices (DASD). DASD storage, for example, can comprise magnetic and/or optical disks, which store bits of data as micrometer sized magnetically or optically altered spots on a disk surface for representing the "ones" and "zeros" that make up those bits of the data. Magnetic DASD, includes one or more disks that are coated with remnant magnetic material. The disks are rotatably mounted within a protected environment. Each disk is divided into many concentric tracks, or closely spaced circles. The data is stored serially, bit by bit, along each track. An access mechanism, known as a head disk assembly (HDA), typically includes one or more read/write heads, and is provided in each DASD for moving across the tracks to transfer the data to and from the surface of the disks as the disks are rotated past the read/write heads. DASDs can store giga-bytes of data with the access to such data typically measured in milli-seconds (orders of magnitudes slower than electronic memory). Access to data stored on DASD is slower due to the need to physically position the disk and HDA to the desired data storage locations.

A third or lower level of data storage includes tape and/or tape and DASD libraries. At this storage level, access to data is much slower in a library since a robot or operator is necessary to select and load the needed data storage medium. The advantage is reduced cost for very large data storage capabilities, for example, tera-bytes of data storage. Tape storage is often used for back-up purposes, that is, data stored at the second level of the hierarchy is reproduced for safe keeping on magnetic tape. Access to data stored on tape and/or in a library is presently on the order of seconds.

Having a back-up data copy is mandatory for many businesses as data loss could be catastrophic to the business. The time required to recover data lost at the primary storage level is also an important recovery consideration. An improvement in speed over tape or library back-up, includes mirroring or dual copy. An example of dual copy involves providing additional DASD's so that data is written to the additional DASDs (sometimes referred to as mirroring). Then if the primary DASDs fail, the secondary DASDs can be relied upon for recovering data. A drawback to this approach is that the number of required DASDs is doubled.

A known method for improving the integrity of the mirroring or dual copy techniques include first storing data to be copied into a temporary storage location (e.g. electronic memory) and then comparing that temporarily stored data to a copy written to the mirroring device. Such a check can compare original data against a copy of that data, or an error checking and correction code of each can be compared. In either case, if no error is returned, then the copy is validated and the temporary data is removed. If an error occurred, the data is recopied and the comparison is repeated. While this method helps ensure data copy integrity, a substantial amount of memory is required, and the system is essentially put on hold (disruptive) while waiting for an indication that integrity is confirmed.

Another data back-up alternative that overcomes the need to double the storage devices involves writing data to a redundant array of inexpensive devices (RAID) configuration. In this instance, the data is written such that the data is apportioned amongst many DASDs. If a single DASD fails, then the lost data can be recovered by using the remaining data and error correction techniques. Currently there are several different RAID configurations available.

The aforementioned back-up solutions are generally sufficient to recover data in the event that a storage device or medium fails. These back-up methods are useful only for device failures since the secondary data is a mirror of the primary data, that is, the secondary data has the same volume serial numbers (VOLSERs) and DASD addresses as the primary data. System failure recovery, on the other hand, is not available using mirrored secondary data. Hence still further protection is required for recovering data if a disaster occurs destroying the entire system or even the site, for example, earthquakes, fires, explosions, hurricanes, etc. Disaster recovery requires that the secondary copy of data be stored at a location remote from the primary data. A known method of providing disaster protection is to back-up data to tape, on a daily or weekly basis, etc. The tape is then picked up by a vehicle and taken to a secure storage area usually some kilometers away from the primary data location. A problem is presented in this back-up plan in that it could take days to retrieve the back-up data, and meanwhile several hours or even days of data could be lost, or worse, the back-up storage location could be destroyed by the same disaster. A somewhat improved back-up method includes transmitting data to a back-up location each night. This allows the data to be stored at a more remote location. Again, some data may be lost between back-ups since back-up does not occur continuously, as in the dual copy solution. Hence, a substantial data amount could be lost which may be unacceptable to some users.

A back-up solution providing a greater degree of protection is remote dual copy which requires that primary data stored on primary DASDs be shadowed at a secondary or remote location. The distance separating the primary and secondary locations depends upon the level of risk acceptable to the user, and for synchronous data communications, can vary from just across a fire-wall to several kilometers. The secondary or remote location, in addition to providing a back-up data copy, must also have enough system information to take over processing for the primary system should the primary system become disabled. This is due in part because a single storage controller does not write data to both primary and secondary DASD strings at the primary and secondary sites. Instead, the primary data is stored on a primary DASD string attached to a primary storage controller while the secondary data is stored on a secondary DASD string attached to a secondary storage controller.

Remote dual copy falls into two general categories, synchronous and asynchronous. Synchronous remote copy involves sending primary data to the secondary location and confirming the reception of such data before ending a primary DASD input/output (I/O) operation (providing a channel end (CE)/device end (DE) to the primary host). Synchronous remote copy, therefore, slows the primary DASD I/O response time while waiting for secondary confirmation. Primary I/O response delay is increased proportionately with the distance between the primary and secondary systems—a factor that limits the remote distance to tens of kilo-meters. Synchronous remote copy, however, provides sequentially consistent data at the secondary site with relatively little system overhead.

Asynchronous remote copy provides better primary application system performance because the primary DASD I/O operation is completed (providing a channel end (CE)/device end (DE) to the primary host) before data is confirmed at the secondary site. Therefore, the primary DASD I/O response time is not dependent upon the distance to the secondary site and the secondary site could be thousands of kilometers remote from the primary site. A greater amount of system overhead is required, however, for ensuring data sequence consistency since data received at the secondary site will often arrive in an order different from that written on the primary DASDs (due to multiple storage controller concurrently writing data to multiple DASDs). A failure at the primary site could result in some data being lost that was in transit between the primary and secondary location.

Real time remote copy for disaster recovery requires that copied DASD volumes form a set. Forming such a set further requires that a sufficient amount of system information be provided to the secondary site for identifying those volumes (VOLSERs) comprising each set and the primary site equivalents. Importantly, a volume at the secondary site forms a "duplex pair" with a volume at the primary site and the secondary site must recognize when one or more volumes are out of sync with the set, that is, "failed duplex" has occurred. Connect failures are more visible in synchronous remote copy than in asynchronous remote copy because the primary DASD I/O is delayed while alternate paths are retried. The primary site can abort or suspend copy to allow the primary site to continue while updates for the secondary site are queued. The primary site marks such updates to show the secondary site is now out of sync.

Maintaining a connection between the secondary site and the primary site with secondary DASD present and accessible, however, does not ensure content synchronism. The secondary site may lose synchronism with the primary site for a number of reasons. The secondary site is initially out of sync when the duplex pair is being formed and reaches sync when an initial data copy is completed. The primary site may break the duplex pair if the primary site is unable to write updated data to the secondary site in which case the primary site writes updates to the primary DASD under suspended duplex pair conditions so that the updating application can continue. The primary site is thus running exposed, that is, without current disaster protection copy until the duplex pair is restored. Upon restoring the duplex pair, the secondary site is not immediately in sync. After applying now pending updates, the secondary site returns to sync. The primary site can also cause the secondary site to lose sync by issuing a suspend command for that volume to the primary DASD. The secondary site re-syncs with the primary site after the suspend command is ended, duplex pair is re-established, and pending updates are copied. On-line maintenance can also cause synchronization to be lost.

When a secondary volume is out of sync with a primary volume, the secondary volume is not useable for secondary system recovery and resumption of primary applications. An out-of-sync volume at the secondary site must be identified as such and secondary site recovery-takeover procedures need to identify the out-of-sync volumes for denying application access (forcing the volumes off-line or changing their VOLSERs). The secondary site may be called upon to recover the primary site at any instant wherein the primary site host is inaccessible—thus the secondary site requires all pertinent information about a sync state of all volumes. More recently introduced data disaster recovery solutions include remote dual copy wherein data is backed-up not only remotely, but also continuously. Such continuous remote dual copy systems improve reliability since a smaller window of exposure exists. As already discussed, when the primary and secondary systems go into "failed duplex", it is known that the primary system is running exposed. However, even when the primary and secondary systems are in "duplex pair" a possibility exists that the data written to the secondary DASD may not be equal to the primary data when read. Due to the non-stop nature of the continuous remote dual copy systems, time for "stop and reconcile" or other traditional batch balance audit functions is not provided.

Given a long running continuous remote copy session, back-up validation is desirable to ensure that the secondary data is a true copy of the primary data. The asynchronous pipeline nature of continuous remote copy complicates a comparison of primary and secondary data. Comparing data sets being dynamically updated by currently running applications requires that data at a selected point in time at the primary be compared to a copy of that data at the secondary at the same point in time in the update sequence. Hence, the point in time at the secondary will actually be later in real time by a propagation delay from the primary to the secondary. Currently, secondary DASD is validated by writing two copies of dump tapes (primary and secondary) and comparing those tapes. Alternatively, a periodic scheduled database consistency validation of the database structures and indices is performed.

Using dump tapes requires an undesirably long delay during which time much errant back-up data may be written, and performing scheduled checks temporarily suspends data back-up. Yet another consideration is a transmission cost when comparing data at different locations (after equivalent point-in-time copies are obtained) which increases with distance due to the costly wide-band communication connection.

Accordingly it is desired to provide a method and apparatus for verifying, in a continuous remote copy system, that selected data at a remote processing location is a valid copy of that data at the primary location, while minimizing communication costs and disruption to running applications.

SUMMARY OF THE INVENTION

An object of the present invention is to provide an improved design and method for validating data shadowed to a secondary site.

Another object of the present invention is to validate selected data at a remote location while minimizing communications costs.

Yet another object of the present invention includes comparing selected data at a point in time at a local site with a copy of that data at a remote site at the same logical point in time in an update sequence in a continuous remote copy system.

According to a first embodiment of the present invention, a method for validating whether shadowed data at a secondary site is a true copy of primary data updates is presented. The primary data updates are generated by one or more applications running in a primary processor at a primary site. Those primary data updates are received by a primary storage subsystem, wherein each primary update is identified by a unique device and subsystem address, the primary storage subsystem causing I/O write operations to write each primary data update therein. A secondary site, whether local to or remote from the primary site, shadows the primary data updates in sequence consistent order such that the secondary site is available for disaster recovery purposes. The method includes running the primary and secondary systems in a full duplex mode of operation such that the primary data updates are continuously shadowed at the secondary site. A validation session is initiated at the primary and secondary sites, including identifying those primary data updates to be validated as properly shadowed at the secondary site.

The primary data mover next determines device and subsystem addresses for the identified primary data updates, and specifies a copy start time for grouping a portion of the identified primary updates to be validated, the copy start time being an equivalent time at the primary and secondary sites for a sequence consistent order of the grouped portion of the identified primary updates and the corresponding shadowed data at the secondary site. First check codes are created at the primary site for the grouped portion of primary data updates, and second check codes are created at the secondary site for the corresponding shadowed data.

Finally, the first and second check codes are compared for determining whether the shadowed data is a true copy of the corresponding primary data updates.

In another embodiment of the present invention, a data shadowing system includes a primary site and a secondary site, wherein the secondary site asynchronously shadows in real time, for disaster recovery purposes, record updates generated by applications running at the primary site. A primary processor runs the applications generating the record updates and issues a corresponding write I/O operation for each record update. The primary processor includes a primary data mover for issuing a validation order to determine whether the record updates are accurately shadowed at the secondary site. The validation order includes a copy start time for defining a portion of record updates to be validated, the copy start time being useable for matching the portion of record updates at the primary site with corresponding shadowed record updates at the secondary site. The content of the corresponding record updates and shadowed record updates are expected to be equivalent, even though the record updates may have been further modified at the primary site and, hence, the corresponding shadowed records may vary in real time. A plurality of primary storage controllers are directed to store the record updates, and execute the issued write I/O operation for each record update. A plurality of primary storage devices receive and store the record updates according to the corresponding write I/O operations. The primary processor and each write I/O are time-stamped by the primary processor, such that write I/O operations are accurately sequence ordered relative to each other. The primary data mover collects sets of record updates and combines each record set information as provided by each one of the plurality of primary storage controllers with the corresponding record update for creating self describing record sets. The self describing record sets are transmitted to the secondary site, wherein the self describing record sets provide information adequate for the secondary site to shadow the record updates therein in sequence consistent order without further communications from the primary site. The primary data mover's issued validation order causes primary and secondary check codes to be generated for the portion of record updates and the corresponding shadowed record updates, respectively. The primary data mover then compares the primary and secondary check codes for copy validation.

The foregoing and other objects, features, and advantages of the invention will be apparent from the following more particular description of a preferred embodiment of the invention, as illustrated in the accompanying drawing.

DESCRIPTION OF THE FIGURES

FIG. 6 is an example sequence for forming a consistency group;

DETAILED DESCRIPTION

Figure 1:
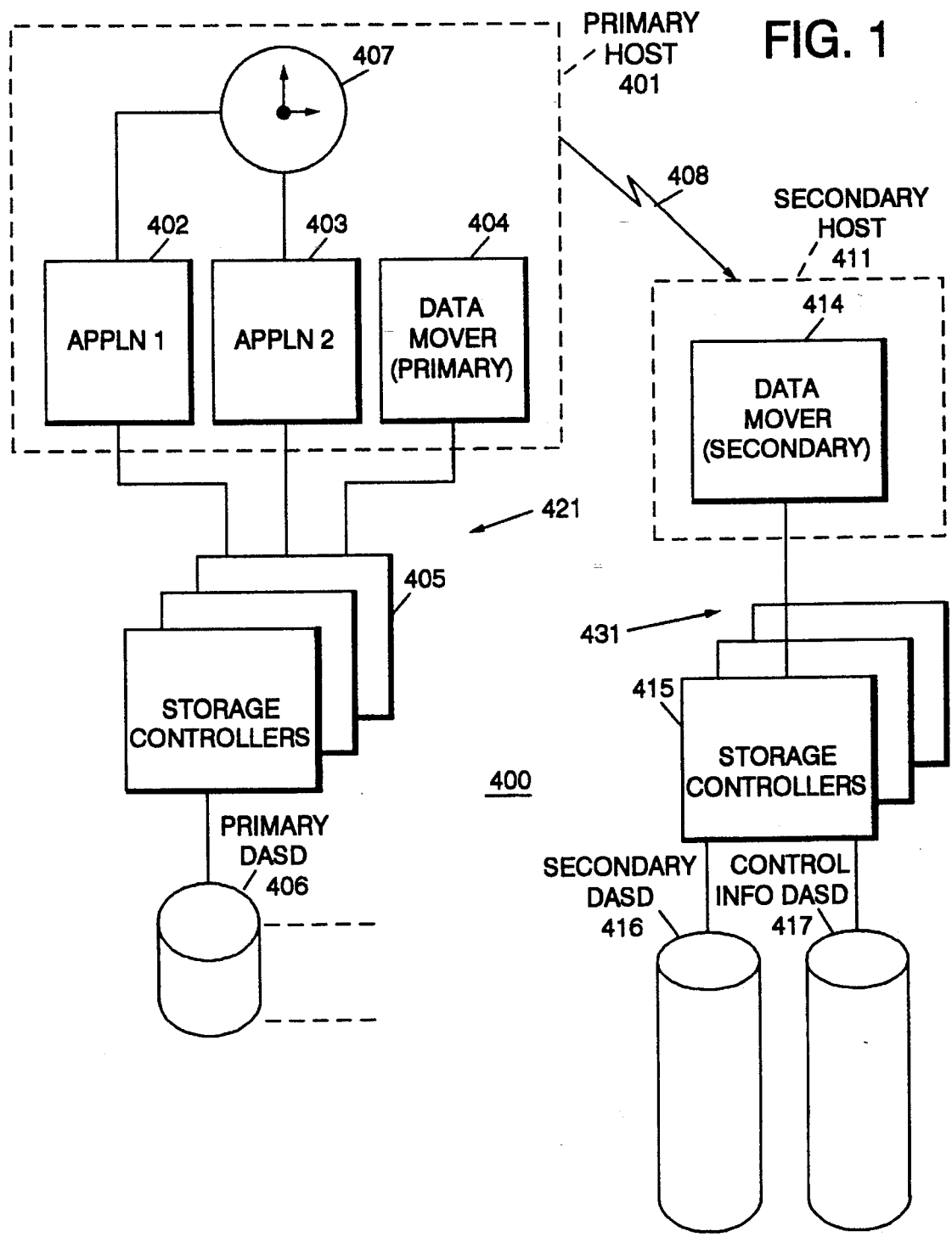
FIG. 1 is a block diagram of a disaster recovery system having asynchronous remote data shadowing capabilities.

A typical data processing system may take the form of a host processor, such as an IBM System/360 or IBM System/370 processor for computing and manipulating data, and running, for example, data facility storage management subsystem/multiple virtual systems (DFSMS/MVS) software, having at least one IBM 3990 storage controller attached thereto, the storage controller comprising a memory controller and one or more cache memory types incorporated therein. The storage controller is further connected to a group of direct access storage devices (DASDs) such as IBM 3390 DASDs. While the host processor provides substantial computing power, the storage controller provides the necessary functions to efficiently transfer, stage/destage, convert and generally access large databases. Disaster recovery protection for the typical data processing system requires that primary data stored on primary DASDs be backed-up at a secondary or remote location. The distance separating the primary and secondary locations depends upon the needs of the particular business, and can vary from several kilo-meters to thousands of kilo-meters. The secondary or remote location, in addition to providing a back-up data copy, must also have enough system information to take over processing for the primary system should the primary system become disabled. Typically, the primary data is stored on a primary DASD string attached to a primary storage controller while the secondary data is stored on a secondary DASD string attached to a secondary storage controller.

The secondary site must not only be sufficiently remote from the primary site, but must also be able to back-up primary data with only a minimal delay. Additionally, the secondary site has to back-up the primary data regardless of the application program (e.g., IMS, DB2) running at the primary site and generating the data and/or updates (i.e., application independent). A difficult task required of the secondary site is that the secondary data must be order consistent, that is, secondary data is copied in the same sequential order as the primary data (sequential consistency) which requires substantial systems considerations. Sequential consistency is complicated by the existence of multiple storage controllers each controlling multiple DASDs in a data processing system. Without sequential consistency, secondary data inconsistent with primary data would result, thus corrupting disaster recovery. Still further, the secondary data can be validated in real time to ensure that the secondary data is a true copy of the primary data.

Alternate remote duplexing systems are described in copending commonly-assigned patent applications Ser. No. 07/992,219 (attorney docket no. TU992079) and Ser. No. 08/036,017 (attorney docket no. SA992097), both of which are hereby incorporated by reference.

ASYNCHRONOUS DATA SHADOWING

Asynchronous remote data shadowing is used when it is necessary to further increase a distance between primary and secondary sites for reducing the probability that a single disaster will corrupt both primary and secondary sites, or when primary application performance impact needs to be minimized. While the distance between primary and secondary sites can now stretch across the earth or beyond, the synchronization of write updates across multiple DASD volumes behind multiple primary subsystems to multiple secondary subsystems is substantially complicated by the asynchronous nature of the data shadowing. Record write updates can be shipped from a primary storage controller via a primary data mover to a secondary data mover for shadowing on a secondary storage subsystem, but the amount of control data passed therebetween must be minimized while still being able to re-construct an exact order of the record write updates on the secondary system across several storage controllers as occurred on the primary system across multiple DASD volumes behind several storage controllers.

FIG. 1 depicts an asynchronous disaster recovery system 400 including a primary site 421 and a remote or secondary site 431. The primary site 421 includes a primary processor 401, for example, an IBM ES/9000 running DFSMS/MVS host software. The primary processor 401 further includes application programs 402 and 403, for example, IMS and DB2 applications, and a primary data mover (PDM) 404. A common sysplex clock 407 is included in the primary processor 401 for providing a common reference to all applications (402,403) running therein, wherein all system clocks or time sources (not shown) synchronize to the sysplex clock 407 ensuring all time dependent processes are properly timed relative to one another. The primary storage controllers 405, for example, synchronize to a resolution appropriate to ensure differentiation between record write update times, such that consecutive write I/O operations to a single primary storage controller 405 will not often exhibit the same time stamp value. The resolution, and not the accuracy, of the sysplex timer 407 is important. The PDM 404, is not connected to the sysplex timer 407, because the PDM 404 is not required to synchronize to the sysplex timer 407 since write I/O operations are not generated therein. A sysplex timer 407 is not required if the primary processor 401 has a single time reference (for example, a single multi-processor ES/9000 system).

A plurality of primary storage controllers 405, for example, IBM 3990 Model 6 storage controllers, are connected to the primary processor 401 via a plurality of channels, for example, fiber optic channels. Connected to each primary storage controller 405 is at least one string of primary DASDs 406, for example, IBM 3390 DASDs. The primary storage controllers 405 and the primary DASDs 406 form a primary storage subsystem. Each storage controller 405 and primary DASD 406 need not be separate units, but may be combined into a single integrated unit.

The secondary site 431, located for example, some thousands of kilo-meters remote from the primary site 421, similar to the primary site 421, includes a secondary processor 411 having a secondary data mover (SDM) 414 operating therein. Alternatively, the primary and secondary sites can be the same location, and further, the primary and secondary data movers can reside on a single host processor (secondary DASDs may be just over a fire-wall). A plurality of secondary storage controllers 415 are connected to the secondary processor 411 via channels, for example, fiber optic channels, as is known in the art. Connected to the storage controllers 415 are a plurality of secondary DASDs 416 and a control information DASD(s) 417. The storage controllers 415 and DASDs 416 and 417 comprise one or more secondary storage subsystems. The primary site 421 communicates with the secondary site 431 via a communication link 408. More specifically, the primary processor 401 transfers data and control information to the secondary processor 411 by a communications protocol, for example, a virtual telecommunications access method (VTAM) communication link 408. The communication link 408 can be realized by several suitable communication methods, including telephone (T1, T3 lines), radio, radio/telephone, microwave, satellite, etc.

The asynchronous data shadowing system 400 encompasses collecting control data from the primary storage controllers 405 so that an order of all data writes to the primary DASDs 406 is preserved and applied to the secondary DASDs 416 (preserving the data write order across all primary storage subsystems). The data and control information transmitted to the secondary site 431, must be sufficient such that the presence of the primary site 421 is no longer required to preserve data integrity.

The applications 402,403 generate data or record updates, which record updates are collected by the primary storage controllers 405 and read by the PDM 404. The primary storage controllers 405 each groups its respective record updates for an asynchronous remote data shadowing session and provides those record updates to the PDM 404 via non-specific primary DASD 406 READ requests. Transferring record updates from the primary storage controllers 405 to the PDM 404 is controlled and optimized by the PDM 404 for minimizing a number of START I/O operations and time delay between each read, yet maximizing an amount of data transferred between each primary storage controller 405 and the primary processor 401. The PDM 404 can vary a time interval between non-specific READs to control this primary storage controller-host optimization as well as a currency of the record updates for the secondary DASDs 416.

Collecting record updates by the PDM 404, and transmitting those record updates to the SDM 414, while maintaining data integrity, requires the record updates to be transmitted for specific time intervals and in appropriate multiple time intervals with enough control data to reconstruct the primary DASDs 406 record WRITE sequence across all primary storage subsystems to the secondary DASDs 416. Reconstructing the primary DASDs 406 record WRITE sequences is accomplished by passing self describing records from the PDM 404 to the SDM 414. The SDM 414 inspects the self describing records for determining whether any records for a given time interval have been lost or are incomplete.

Figure 2:
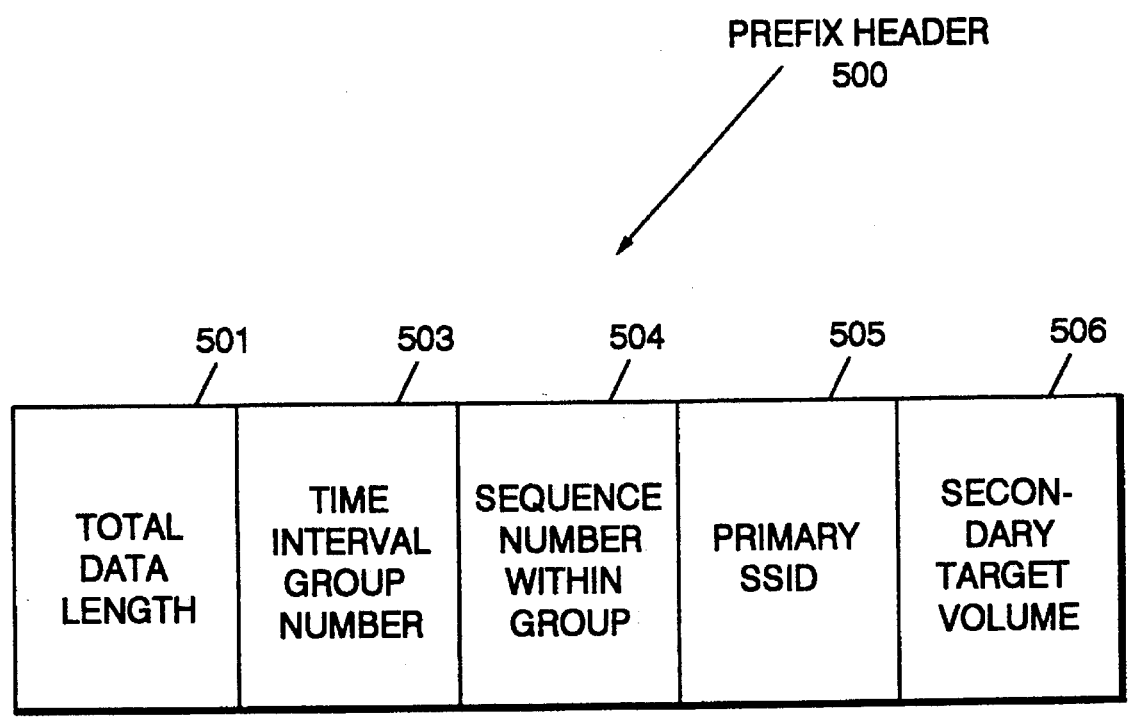
FIG. 2 is a data format diagram showing a prefix header that prefixes read record sets from the primary site of FIG. 1.
Figure 3:
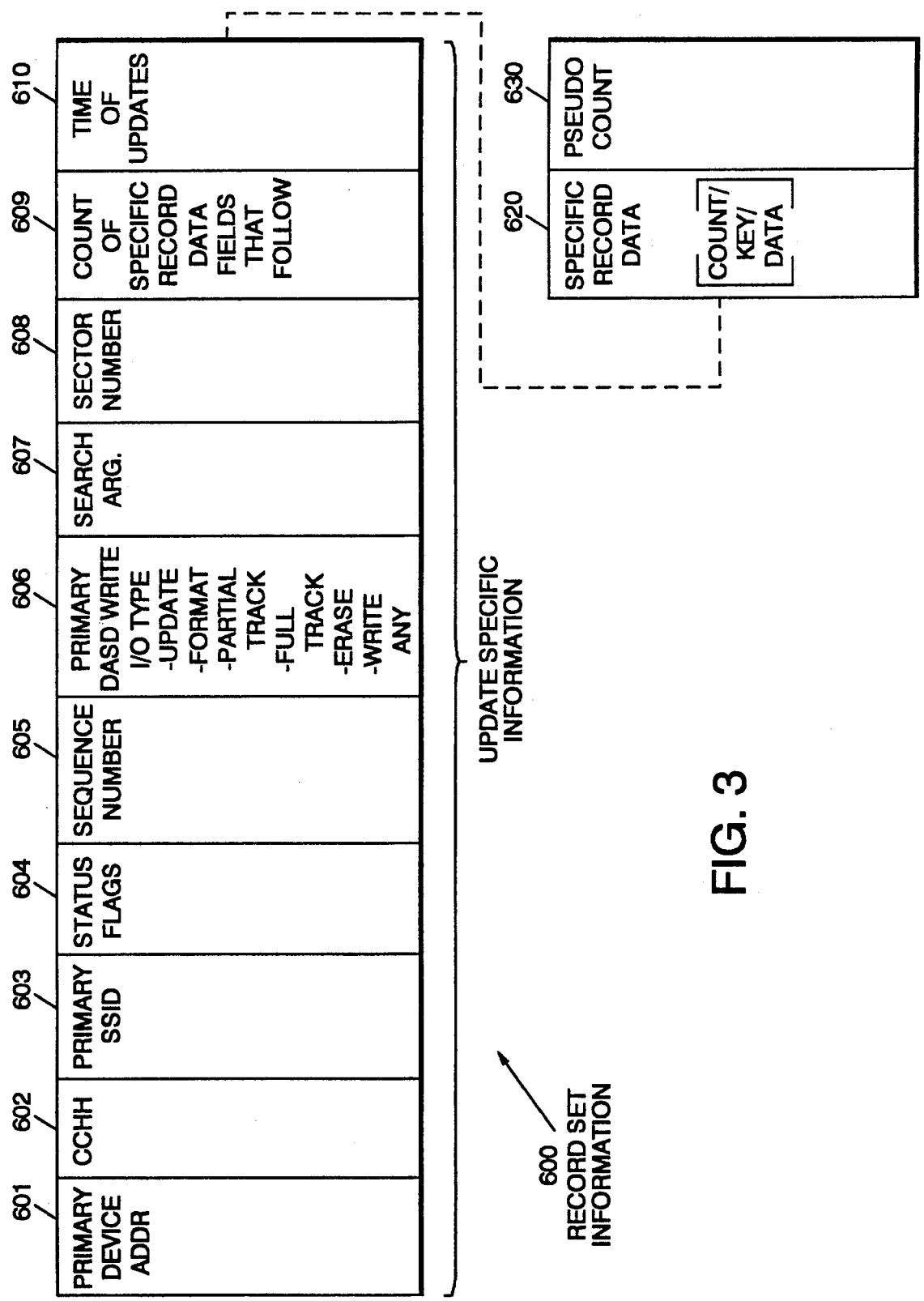
FIG. 3 is a data format diagram describing fields making up a read record set.

FIGS. 2 and 3 show a Journal record format created by the PDM 404 for each self describing record, including a prefix header 500 (FIG. 2), and a record set information 600 (FIG. 3) as generated by the primary storage controller 405. Each self describing record is further journaled by the SDM 414 for each time interval so that each self describing record can be applied in time sequence for each time interval to the secondary DASDs 416.

Referring now to FIG. 2, the prefix header 500, which is inserted, for example, at the front of each record set, includes a total data length 501 for describing the total length of the prefix header 500 and actual primary record set information 600 that is transmitted to the SDM 414 for each record set. An I/O time 610 (FIG. 3) of the primary DASDs 406 write is provided for each primary storage controller 405 READ RECORD SET.

A READ RECORD SET command is issued by the PDM 404 and can be predicated upon one of the following conditions:

(1) Primary storage controller 405 attention interrupt based upon that primary storage controller predetermined threshold;

(2) Primary processor 401 timer interrupt based upon a predetermined time interval; or (3) Record set information indicates additional information on outstanding record sets available but not yet read.

Condition (2) uses a timer interval to control how far behind the secondary system 431 executes during periods of low activity. Condition (3) occurs when the PDM 404 fails to drain all record sets during a processing interval which drives further activity for ensuring that the PDM 404 keeps up with primary storage controller 405 activity.

A time interval group number 503 is supplied by the PDM 404 to identify a time interval for which the current record sets belong (sets of records across all primary storage controllers 405 for a given time interval group form consistency groups). A sequence number within group 504 is derived based upon a hardware provided identification (to the PDM 404) of a write sequence order of application WRITE I/Os for primary storage controller 405 for each record set within a given time interval group 503. A primary SSID (subsystem identification) 505 uniquely identifies the specific primary storage controller of the primary storage controllers 405 for each record set. A secondary target volume 506 is assigned by a system administrator.

Referring now to FIG. 3, the record set information 600 is generated by the primary storage controllers 405 and collected by the PDM 404. Update Specific Information 601–610, includes a primary device unit address 601 of each record set indicating the actual primary DASD 406 that the record update occurred on. A cylinder number/head number (CCHH) 602 indicates a location on primary DASD 406 for each record set. Primary SSID 603, the primary storage controller session identifier is the same as primary SSID 505. Status flags 604 provide status information regarding whether specific data records 620 follow. Sequence number 605 assigns a number to each record set for indicating whether the entire record set has been read (all data transferred to the PDM 404) in conjunction with a pseudo count field 630. Primary DASD write I/O type 606 is an operation indicator identifying the type of write operation performed on each record in the record set, the operation indicators including: update write; format write; partial track records follow; full track data follows; erase command performed; or write any performed. Search argument 607 indicates initial positioning information for the first read record set data record 620. A sector number 608 identifies that sector that the record was updated at. Count field 609 describes a number of specific record count, key and data fields 620 that follow. A host application time when the primary DASD 406 write update occurred is recorded in time of updates 610. Specific record data 620 provides a count/key/data (CKD) field of each record update. Lastly, the pseudo count field 630 is compared to a predetermined pattern, for example eight bytes of "FF", indicating whether the entire read record set was transferred to the PDM 404.

The update records are handled in software groups called consistency groups so that the SDM 414 can copy the record updates in the same order they were written at the primary DASDs 406. The information used for creating the consistency groups (across all record sets collected from all storage controllers 405) includes the: operational time stamp 502; sequence number within group 504; primary controller SSID 505; primary device address 601; the primary SSID 603; and the status flags 604. The information used for determining whether all records for a time interval group have been received for each storage controller 405 at the SDM 414 includes the: sequence number within group 504; physical controller ID 505; the primary SSID 603; and a total number of read record sets returned from each primary storage controller 405 for each operational time interval. The information necessary to place record updates on the secondary DASDs 416 equivalently to the primary DASDs 406 record updates with full recovery possible includes the: secondary target volume 506; CCHH 602; primary DASD write I/O type 606; search argument 607; sector number 608; count 609; time of updates 610; and the specific record data 620.

Figure 4:
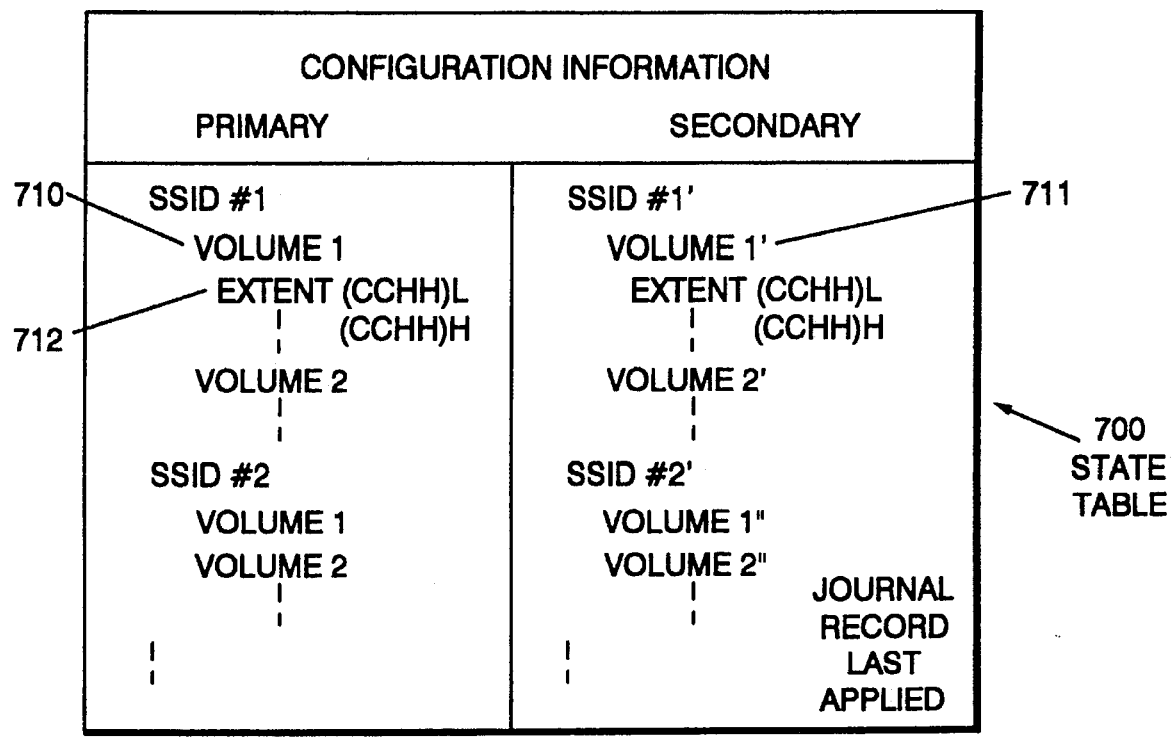
FIG. 4 is a state table identifying volume configuration information.
Figure 5:
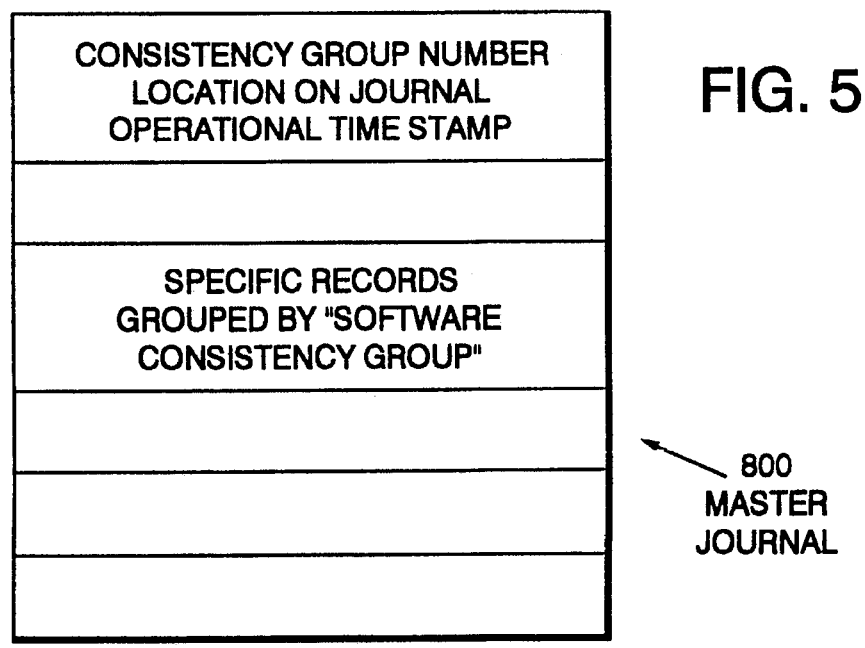
FIG. 5 is a master journal as used by the secondary site of FIG. 1.

FIGS. 4 and 5 show a state table 700 and a master journal 800, respectively, for describing a current journal contents, which simplifies recovery time and journal transfer time. The state table 700 provides configuration information, collected by and common to the PDM 404 and SDM 414, and includes primary storage controller session identifiers (SSID numbers) and the volumes therein, and the corresponding secondary storage controller session identifiers and the corresponding volumes. Thus the configuration information tracks which primary volumes 710 or primary DASD extends map to secondary volumes 711 or secondary DASD extends. With a simple extension to the state table 700 indicating partial volume extends 712 (CCHH to CCHH), partial volume remote copy can be accomplished using the same asynchronous remote copy methods described herein, but for a finer granularity (track or extent) than full volume.

The master journal 800 includes: consistency group number; location on journal volumes; and operational time stamp. The master journal 800 further maintains specific record updates as grouped in consistency groups. The state table 700 and master journal 800 support disaster recovery, and hence must be able to operate in a stand-alone environment wherein the primary system 401 no longer exists.

A time stamp control is placed at the front and back of each master journal 800 to ensure that the entire control entry was successfully written. The time stamp control is further written to the secondary DASDs 417. The control elements include dual entries (1) and (2), wherein one entry is always a current entry, for example:

(1) Timestamp control |Control Info| Timestamp Control (2) Timestamp Control |Control Info| Timestamp Control.

At any point in time either entry (1) or (2) is the current or valid entry, wherein a valid entry is that entry with equal timestamp controls at the front and back. Disaster recovery uses the valid entry with the latest timestamp to obtain control information. This control information, along with state information (environmental information regarding storage controllers, devices, and applied consistency groups), is used for determining what record updates have been applied to the secondary storage controllers 415.

CONSISTENCY GROUPS

After all read record sets across all primary storage controllers 405 for a predetermined time interval are received at the secondary site 431, the SDM 414 interprets the received control information and applies the received read record sets to the secondary DASDs 416 in groups of record updates such that the record updates are applied in the same sequence that those record updates were originally written on the primary DASDs 406. Thus, all primary application order (data integrity) consistency is maintained at the secondary site 431. This process is hereinafter referred to as forming consistency groups. Forming consistency groups is based on the following assumptions: (A) application writes that are independent can be performed in any order if they do not violate controller sequence order; (B) application writes that are dependent must be performed in timestamp order, hence an application cannot perform a dependent write number two before receiving control unit end, device end from write number one; and (C) a second write will always be either (1) in a same record set consistency group as a first write with a later timestamp or (2) in a subsequent record set consistency group.

Referring to FIG. 6, an example of forming a consistency group (the consistency group could be formed at either the primary site 421 or secondary site 431), for example, for storage controllers SSID 1, SSID 2, and SSID 3 is shown (any number of storage controllers can be included but only three are used in this example for clarity). Time intervals T1, T2 and T3 are assumed to occur in ascending order. A time interval T1 is established for storage controllers SSID 1, SSID 2 and SSID 3. The PDM 404 obtains record set data from storage controller SSIDs 1, 2, and 3 for time interval T1–T3. The record sets for SSIDs 1, 2, and 3 for time interval T1 are assigned to time interval group 1, G1 (time interval group number 503). The sequence number within group 504 is shown for each SSID 1, 2, and 3, wherein SSID has three updates as 11:59. 12:00, and 12:01, SSID 2 has two updates at 12:00 and 12:02, and SSID 3 has three updates at 11:58, 11:59, and 12:02. Record sets of time intervals T2 and T3 are listed but example times of updates are not given for simplicity.

Consistency group N can now be formed based upon the control information and record updates received at the secondary site 431. In order to ensure that no record update in time interval group number one is later than any record update of time interval group number two, a min-time is established which is equal to the earliest read record set time of the last record updates for each storage controller SSID 1, 2, and 3. In this example then, min-time is equal to 12:01. Any record updates having a read record set time greater than or equal to min-time is included in the consistency group N+1. If two record update times to a same volume were equal, though unlikely given sufficient resolution of the sysplex timer 407, the record update having the earlier sequence number within the time interval group N is kept with that group for consistency group N. Record updates having equal times will cause the record update having the lower sequence number to be placed before the later sequence numbered record update. Alternatively, record updates having equal time stamps, but to differing volumes, may be ordered arbitrarily as long as they are kept in the same consistency group.

If a primary storage controller 405 fails to complete a response to a read record set during a specified time interval, then a consistency group cannot be formed until that primary storage controller 405 completes. In the event that the primary storage controller 405 fails to complete its operation, then a missing interrupt results causing a system missing interrupt handler to receive control and the operation will be terminated. On the other hand, if the primary storage controller 405 timely completes the operation then the I/O will complete and normal operation will continue. Consistency group formation expects that write operations against the primary storage controllers 405 will have time stamps. Some programs, however, will cause writes to be generated without time stamps, in which case the primary storage controller 405 will return a current session time. Consistency group formation can bound those records without time stamps based upon the timestamp from other write I/O timestamps. If too many record updates without time stamps occur over a time interval such that the record updates are not easily bounded by consistency group times, then an error that the duplex volumes are out of synchronization may result.

Figure 7:
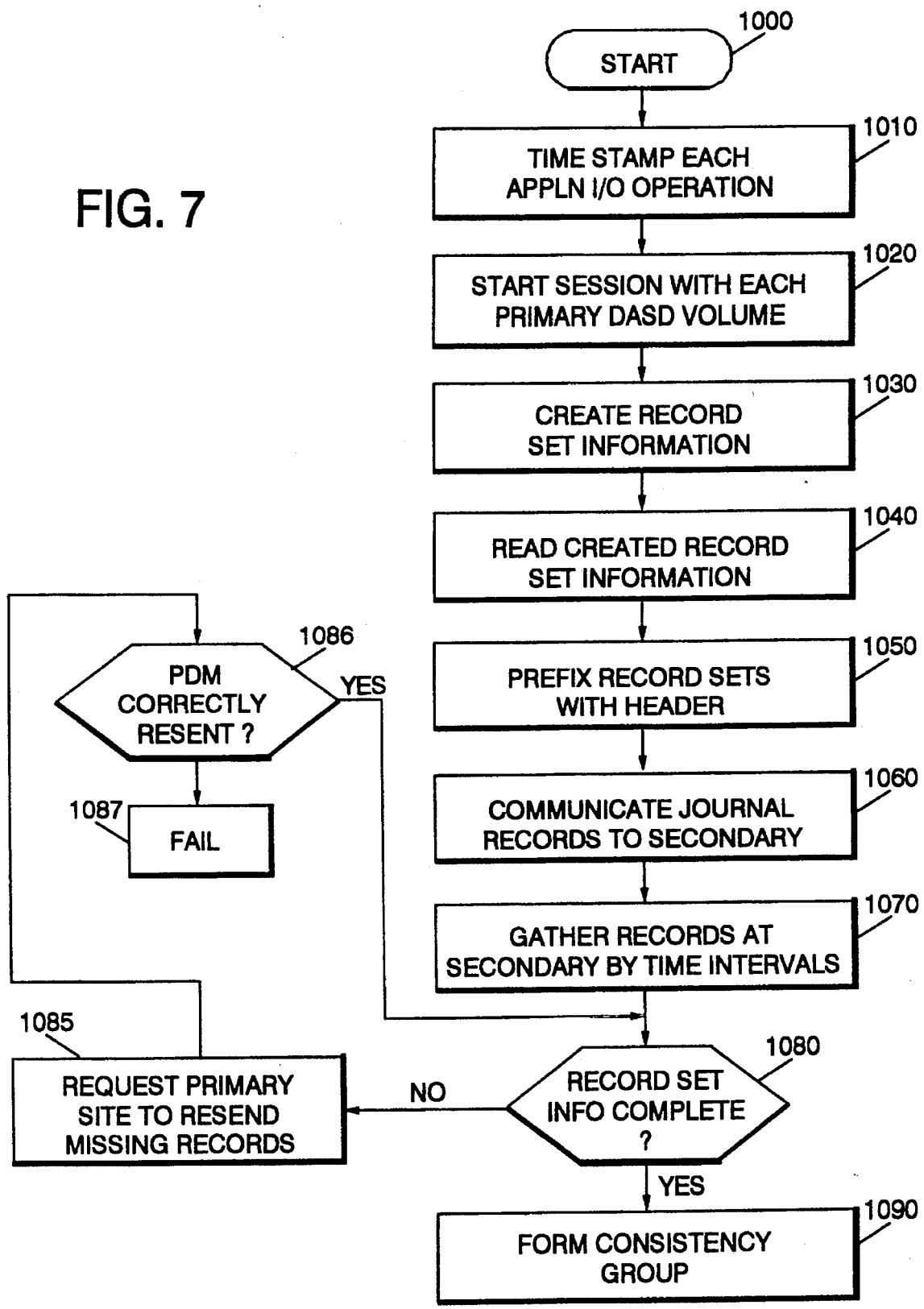
FIG. 7 is a flow diagram showing a method of collecting information and read record sets for forming consistency groups.
Figure 8:
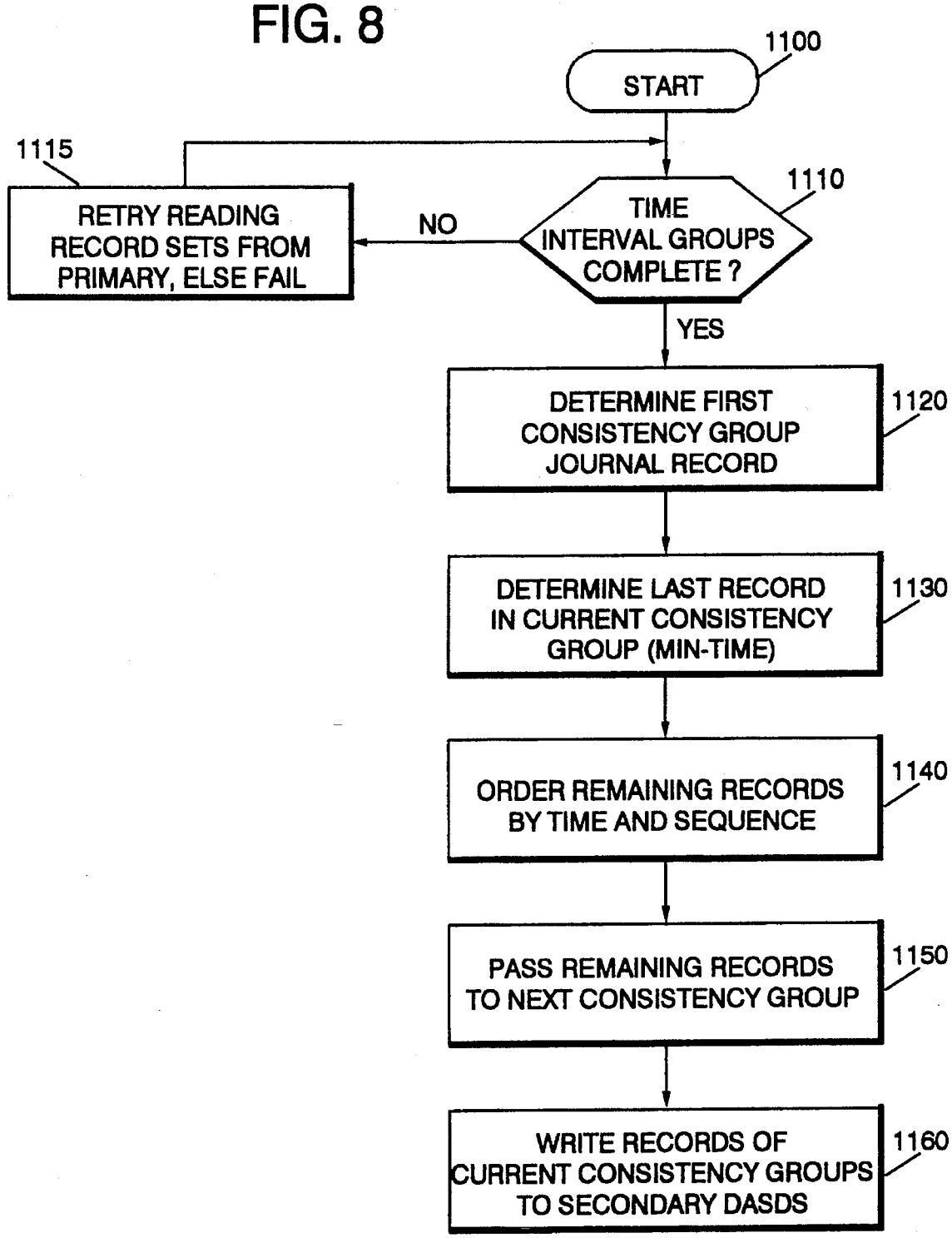
FIG. 8 is a flow diagram showing a method of forming consistency groups.

FIGS. 7 and 8 are flow diagrams presenting the method of forming consistency groups. Referring to FIG. 7, the process starts at step 1000 with the primary site 421 establishing remote data shadowing. At step 1010 all application I/O operations are time stamped using the sysplex timer 407 as a synchronization clock (FIG. 1). The PDM 404 starts a remote data shadowing session with each primary storage controller 405 at step 1020 which includes identifying those primary volumes that will have data or records shadowed. Record set information 600 is created by the primary storage controllers 405 for each application WRITE I/O operation (see FIG. 3) by step 1030.

Step 1040 involves the PDM 404 reading the record set information 600 from each primary storage controller 405 according to a prompt including an attention message, a predetermined timing interval, or a notification of more records to read as described earlier. When the PDM 404 begins reading record sets, at step 1050, the PDM 404 prefixes each record set with a prefix header 500 (see FIG. 2) for creating specific journal records (a journal record includes the prefix header 500 and the record set information 600). The Journal records contain the control information (and records) necessary for forming consistency groups at the secondary site 431.

At step 1060 the PDM 404 transmits the generated journal records to the SDM 414 via the communications link 408 (or within the same data mover system if the consistency groups are formed therein). The SDM 414 uses the state table 700 at step 1070 to gather the received record updates by group and sequence numbers for each time interval group and primary storage controller 405 established for the data shadowing session. The SDM 414 inspects the journal records at step 1080 to determine whether all record information has been received for each time interval group. If the journal records are incomplete, then step 1085 causes the SDM 414 to notify the PDM 404 to resend the required record sets. At step 1086, the PDM 404 resends the needed record sets, and again step 1080 determines whether the record set is complete. If the PDM 404 is unable to correctly resend, then the duplex volume pair is failed at step 1087. If the journal records are complete, then step 1090 is performed which encompasses the SDM 414 forming the consistency groups.

Referring to FIG. 8, steps 1100–1160 representing step 1090 (FIG. 7) for forming consistency groups is shown. Consistency group formation starts at step 1100 wherein each consistency group is written to an SDM 414 journal log ("hardened") on the secondary DASD 417 (FIG. 1). Step 1110 performs a test for determining whether the time interval groups are complete, that is, each primary storage controller 405 must have either presented at least one read record set buffer or have confirmation from the PDM 404 that no such record updates were placed in the record set buffer, and all read record set buffers with data (or null) must have been received by the SDM 414. If a time interval group is incomplete, then step 1110 retries reading the record sets from the primary storage controller 405 until the required data is received. If errors occur, a specific duplex volume pair or pairs may be failed. Having received complete time interval groups, step 1120 determines a first consistency group journal record. The first (or current) consistency group journal record is that record which contains the earliest time of update 610.

Step 1130 inspects the records contained in the current consistency group journal record to determine which record will be the last record to be included therein (some records will be dropped and included in the next consistency group journal record). The last record in the current consistency group journal record is determined as a minimum update time (min-time) of the maximum update times for each primary storage controller 405 (that is, the last update of each primary storage controller 405 is compared and only the earliest of these remains in the current consistency group journal record).

Those remaining record updates in the current consistency group journal record are ordered according to time of update 610 and sequence number within group 504 by step 1140. A primary storage controller 405 that had no record updates does not participate in the consistency group. At step 1150, the remaining record updates of the current consistency group (having update times later than min-time) are passed to the next consistency group. Each sequence number within a group 504 should end with a null buffer indicating that all read record sets have been read for that operational time interval. If the null buffer is absent, then the step 1130 of defining the last record in the current consistency group, coupled with the time of update 610 can be used to determine the proper order of the application WRITE I/O operations across the primary storage controllers 405.

Step 1160 represents a back-end of the remote data shadowing process wherein specific write updates are applied to secondary DASDs 416 under full disaster recovery constraint. If when writing the updates to the secondary DASDs 416 an I/O error occurs, or the entire secondary site 431 goes down and is re-initialized, then the entire consistency group that was in the process of being written can be re-applied from the start. This permits the remote shadowing to occur without having to track which secondary DASDs 416 I/Os have occurred, which I/Os have not occurred, and which I/Os were in process, etc.

COPY VALIDATION

Thus far, a system and method has been described for a continuously operating remote copy facility so that critical data created at a primary site can be safely backed-up at a remote site. Although the continuously operating remote copy has been illustrated using consistency groups, one skilled in the art will recognize that other adequate methods of continuously shadowing data are available. A further degree of data consistency or security can be realized by not only duplicating that data, but additionally continuously validating the data copy as a true reflection of the primary data. Copy validation presents several barriers including the potentially high cost of re-transmitting the copy back to the primary for comparison, the extra system time required to perform the copy audit, and comparing the secondary copy to the primary data at a given point in real time, when some primary data may have again been updated and is no longer equivalent to the secondary copy.

Copy validation, as described herein, is realized by causing a point-in-time check code to be effected at the remote copy location to represent a data copy there at the same logical point in time in a DASD write sequence as a base check code generated at the primary site of that same data, though the data and data copy may have different content in real time.

Figure 9:
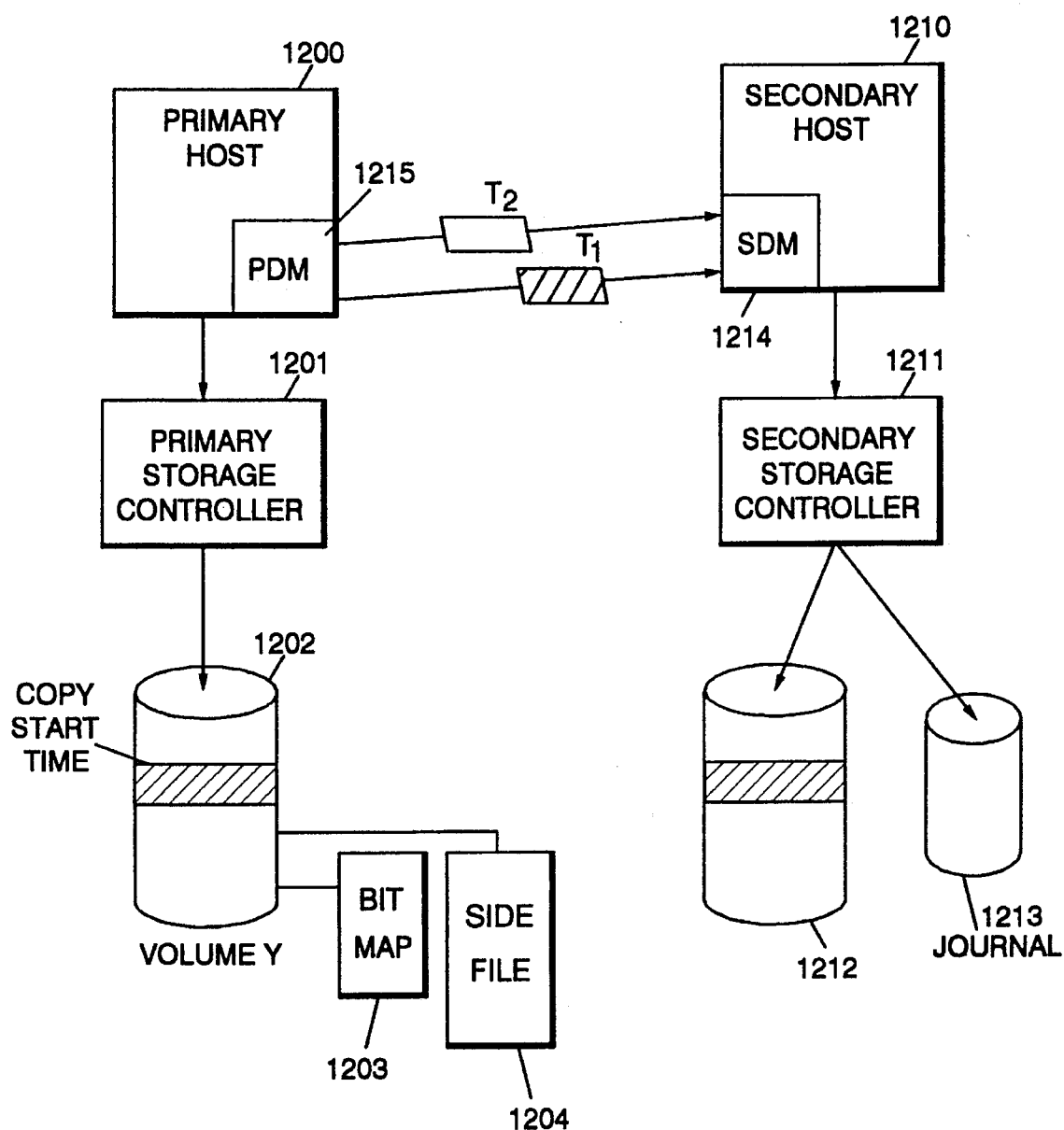
FIG. 9 is a block diagram of a portion of the disaster recovery system of FIG. 1 depicting copy validation.

Referring now to FIG. 9, data copy validation is described using a simplified system wherein only a single primary volume and a single secondary volume exists for clarity of illustration. In FIG. 9, at a primary site a storage controller 1201, under control of primary host 1200, writes data or updates to a volume Y on DASD 1202. Data updates are sent to the SDM 1214 in consistency groups (T1, T2, etc.) to be written thereat under the control of the secondary host 1210. As is known, in a concurrent copy system a protection bit map 1203 identifies those files read from the DASD 1202, wherein those files are temporarily stored in the sidefile 1204 (point-in-time data for validation). In this way, files on the DASD 1202 can be preserved (subsequent updates do not overwrite a previous update, but co-exists therewith) until those point-in-time files (data) or check codes are read by the primary data mover 1205.

At a primary concurrent copy point-in-time (hereinafter referred to simply as copy start time), a code is generated for data read by point-in-time copy operations, for example, a cyclic redundancy code (CRC). After starting to write the consistency group T1 to the secondary DASD 1212, at a secondary copy start time (logically equivalent to the primary copy start time) a like CRC is generated for those same files (data). The CRCs can thereafter be compared to validate that the secondary copy is a true copy of the primary data. A Journal 1213 can receive those data updates at the secondary (for example, data from consistency group T2) that would otherwise update data at the secondary so as to no longer represent the state of the data at the predetermined copy start time. Similarly, if after the predetermined copy start time, an update was applied to data at the primary at volume Y, the data, as it exists before any updates after the predetermined copy start time, would be written to the sidefile and that original data would be used in generating the check code. Hence, a comparison can be made of primary data to a secondary copy at an equal logical point in time, though the data may actually differ in real time.

Figure 10:
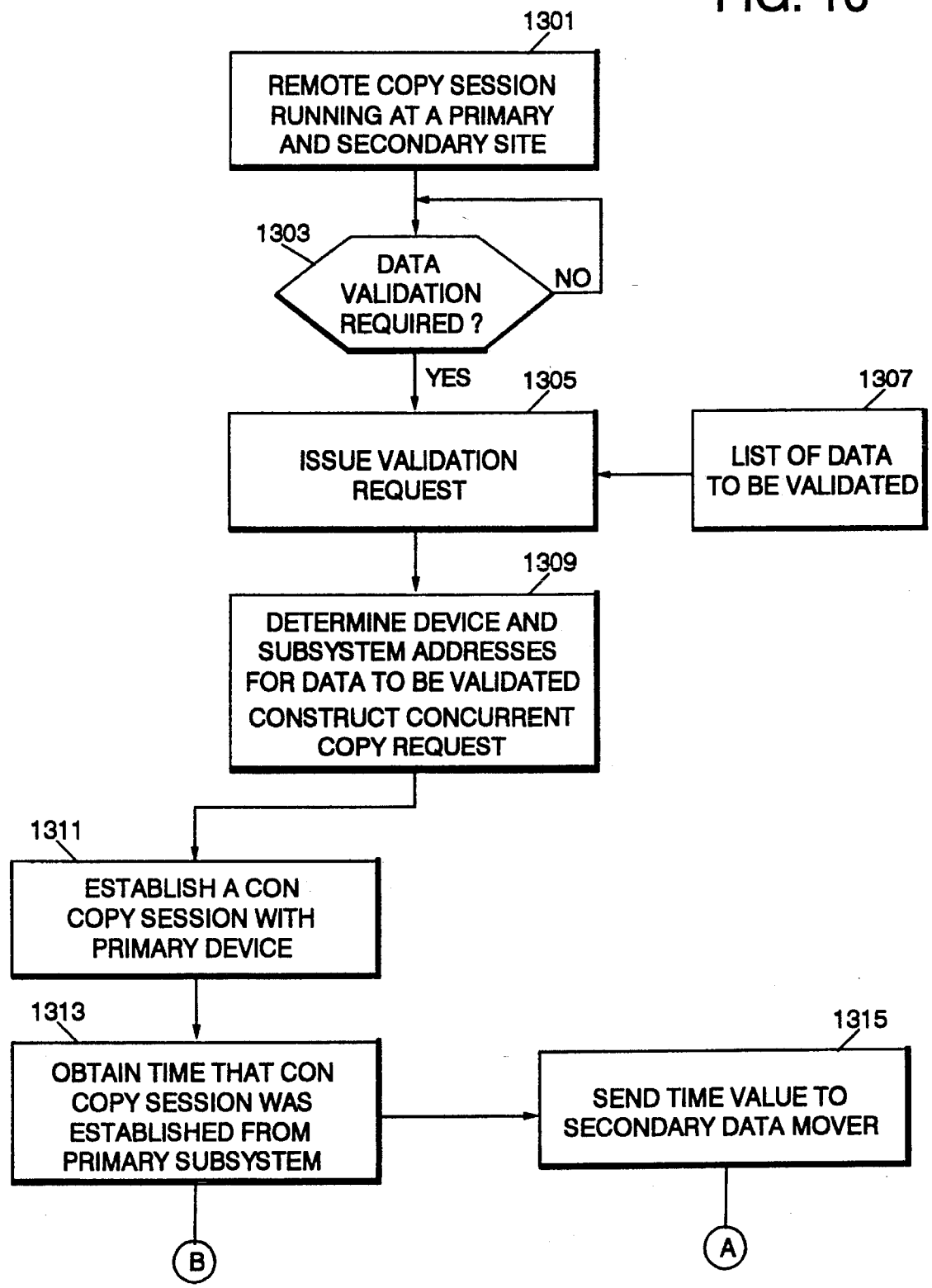
FIG. 10 is a flow diagram of a preferred embodiment of the data validation technique according to the present invention.
Figure 11:
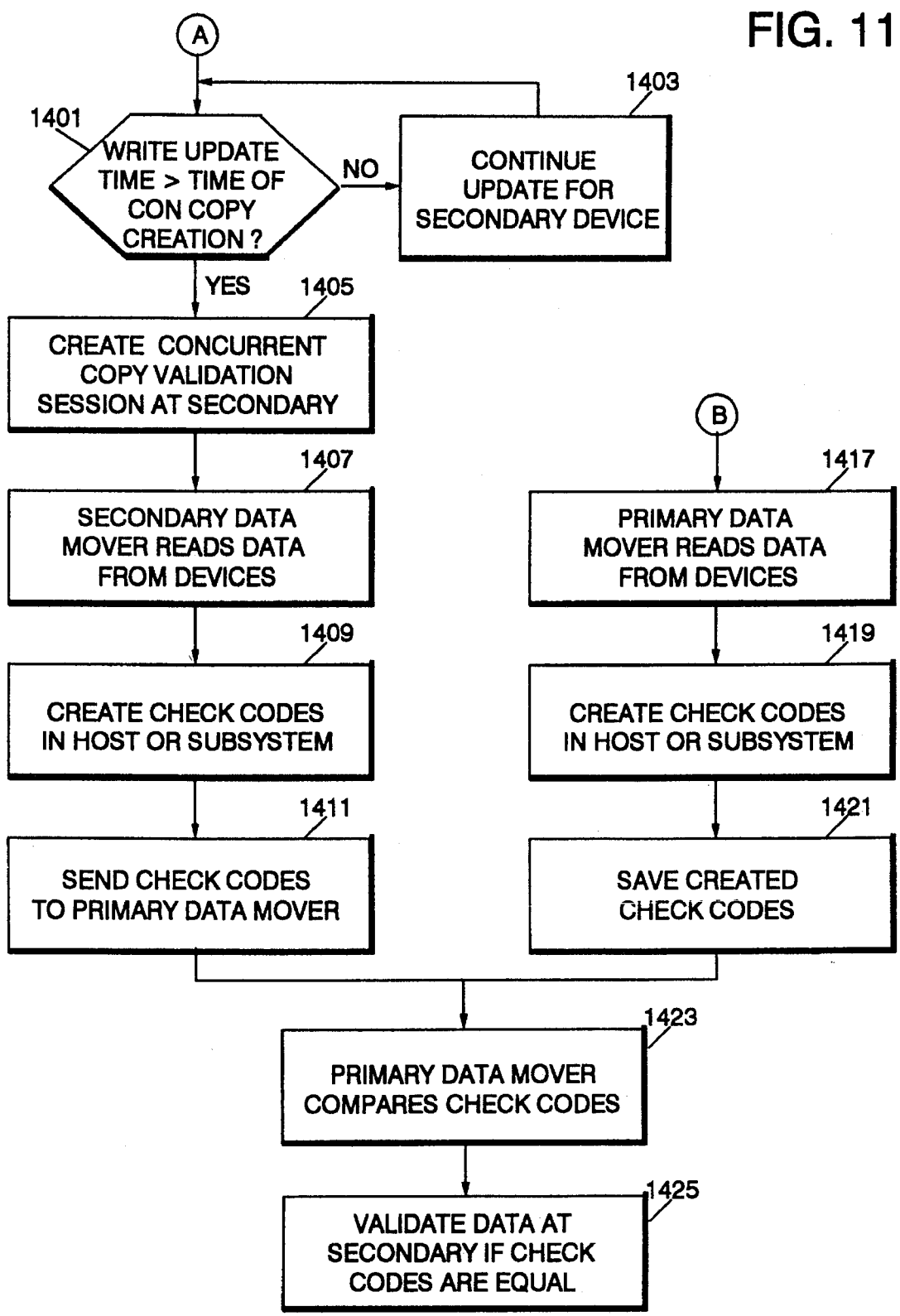
FIG. 11 is a continuation of the flow diagram of FIG. 10 of the preferred embodiment of the data validation technique according to the present invention.

FIGS. 10 and 11 present a method of data validation according to the present invention in flow diagram form. In FIG. 10, a step 1301 includes a currently operating remote data shadowing process, for example, continuously remote copy using consistency groups running at the primary and secondary locations. The specific data shadowing application may vary, which in turn may affect identification of a synchronization boundary time, which identification should be apparent according to the following description, as specifically applied to consistency groups. Given that a remote copy session is running, a step 1303 determines whether data validation is requested or required. Data validation can be triggered by recognizing updates to data defined as critical, based upon time of day (critical applications running), as requested by an operator, or as otherwise required.

In step 1305 a VALIDATE request is issued to copy service software, for example, to the primary data mover in the primary host. The VALIDATE request can be input by a system operator along with a list of data that is to be validated in step 1307. The primary data mover, at step 1309, constructs a concurrent copy request for all DASDs containing extends of the identified data to be copy-validated. All appropriate device and subsystem addresses are identified for that data which is to be validated. The current copy request is qualified by the copy start time that identifies when a point-in-time copy is to be effected, and further by the VALIDATE request. The copy start time when the point-in-time copy is to be effected may by indicated as "now".

At step 1311 a concurrent copy session is established at the secondary site with the identified primary devices. The secondary site at step 1313 obtains a concurrent copy establish time from the primary subsystem, and that establish time is provided to the secondary data mover at step 1315.

The secondary storage system will continue to update data copies for the consistency group unit at step 1403 until the last data has been updated, step 1401. Note that at the primary site the copy start time will occur some time prior to the last update for that consistency group at the secondary site. When the consistency group for the copy start time has been completely updated at the secondary storage subsystem, step 1405 creates a copy validation session at the secondary storage subsystem. At steps 1407 and 1417, the secondary and primary data movers read data to be validated from the respective storage devices (step 1417 may actually occur earlier in time). In effect, the secondary write 1160 of the consistency group that encompasses the copy start time will be performed as two subgroups, one subgroup time stamps up to the copy start time and another subgroup with time stamps following the copy start time.

If the primary and/or secondary storage subsystems have the capabilities to generate check codes, then at steps 1409 and 1419, those check codes can be returned to the primary and secondary host systems. Otherwise, the primary and secondary host systems will generate the check codes. The check codes can be created on a per track basis wherein source check codes are discarded. Alternatively, the check codes can be generated on a per record basis, etc. At step 1411 the secondary data mover sends the check codes from the secondary site to the primary site. The check codes generated at the primary site are saved at step 1421. Upon receiving the check codes from the secondary site, the primary data mover compares the primary and secondary check codes at step 1423. Alternately, the primary data mover could send the primary check codes to the secondary site for comparison there. Still further, depending upon data transmission efficiencies, copies of the actual data, and not codes thereof, could be used for validation comparisons.

If the check codes were generated based upon track data, those check codes must be formed only over DASD track key and data field content, wherein count field data is discarded (for CKD track format). In the case of fixed block architecture (FBA) format, the check code must be formed on data field content while excluding block (or sector) ID fields. This is necessary since the copy software at the secondary site may locate extends of data at the secondary in different relative physical track or block sequences. Additionally, the check codes may vary in size, wherein larger check codes providing better protection against false positive compare. The choice of check code, could be formed by exclusive-or of a 16-bit CRC per data record. Step 1425 validates the data at the secondary if the check codes are found to be equal. If the check codes do not match then corrective action is required.

While the invention has been particularly shown and described with reference to preferred embodiments thereof, it will be understood by those skilled in the art that various changes in form and details may be made therein without departing from the spirit and scope of the invention. For example, copy-audit validation function as described herein can be applied to shadowed data in different environments wherein the method of shadowing data can vary, for example, in a RAID architecture. The consistency groups have been described as being formed by the secondary data mover based upon received self describing record sets, however, the consistency groups could be formed at the primary site based upon write record sets or elsewhere in the secondary site. The data formats used by the storage devices at the primary and secondary sites need not be identical. For example, CKD records could be converted to fixed block architecture (FBA) type records, etc. Nor are the storage devices meant to be limited to DASD devices.

What is claimed is:

1. A method for validating whether shadowed data is a true copy of primary data updates, wherein the primary data updates are generated by one or more applications running in a primary processor at a primary site, the primary data updates received by a primary storage subsystem, each primary data update identified by a unique device and subsystem address, the primary storage subsystem causing I/O write operations to write each primary data update therein, and wherein a secondary site, whether local to or remote from the primary site, shadows the primary data updates in sequence consistent order such that data at the secondary site is available for disaster recovery purposes, the method comprising steps of:

(a) operating the primary and secondary sites in a full duplex mode such that the primary data updates are continuously shadowed at the secondary site;

(b) initiating a validation session in the primary and secondary sites, including identifying those primary data updates to be validated as properly shadowed at the secondary site;

(c) determining device and subsystem addresses for the identified primary data updates;

(d) specifying a copy start time for grouping a portion of the identified primary data updates to be validated, the copy start time being a logically equivalent time at the primary and secondary sites for the grouped portion of the identified primary data updates and the corresponding shadowed data at the secondary site;

(e) creating first check codes at the primary site for the grouped portion of primary data updates, and creating second check codes at the secondary site for the corresponding shadowed data; and (f) comparing the first and second check codes for determining whether the shadowed data is a true copy of the corresponding primary data updates.

2. The method according to claim 1 wherein each primary data update is time stamped according to a corresponding I/O write operation.

3. The method according to claim 2 wherein the grouped portion of primary data updates is identified by corresponding device and subsystem addresses and by time stamps being bounded by sequential copy start times.

4. The method according to claim 3 wherein the grouped portion of primary data updates form at least a portion of a consistency group such that the grouped portion of primary data updates is an interval group of self describing record sets.

5. The method according to claim 4 wherein each interval group is bounded by consecutive operational time stamps.

6. The method according to claim 5 further comprising a step (g) determining at the secondary site whether each received self describing record set is complete.

7. The method according to claim 5 wherein the step (g) further includes the secondary site requesting the primary site to re-transmit any missing primary data updates if the secondary site determines a self describing record set is incomplete.

8. The method according to claim 7 further comprising a step (h) writing the received primary data updates at the secondary site to the secondary storage subsystem according to the sequence of the corresponding write I/O operations at the primary site as ordered in the consistency groups.

9. The method according to claim 1 wherein the first and second check codes are cyclic redundancy codes.

10. The method according to claim 9 wherein the cyclic redundancy codes operate upon data extends.

11. A data shadowing system including a primary site and a secondary site, the secondary site asynchronously shadowing in real time, record updates generated by applications running at the primary site, the primary site comprising:

a primary processor running the applications generating the record updates and issuing a corresponding write I/O operation for each record update, the primary processor having a primary data mover therein for issuing a validation order to determine whether the record updates are accurately shadowed at the secondary site, the primary data mover further describing a copy start time for defining a portion of record updates to be validated, the copy start time useable for matching the portion of record updates at the primary site with corresponding shadowed record updates at the secondary site wherein the content of the corresponding record updates and shadowed record are expected to be equivalent at the copy start time though the contents of such record updates and corresponding shadowed records may vary in real time;

a plurality of primary storage controllers directed to store the record updates, the plurality of primary storage controllers executing the issued write I/O operation for each record update; and a plurality of primary storage devices receiving and storing the record updates therein according to the corresponding write I/O operations, wherein the primary processor and each write I/O are time-stamped by the primary processor, such that write I/O operations are accurately sequence ordered relative to each other, the primary data mover collecting sets of record updates and combining each record set information as provided by each one of the plurality of primary storage controllers with the corresponding record update for creating self describing record sets, the self describing record sets being transmitted to the secondary site, wherein the self describing record sets provide information adequate for the secondary site to shadow the record updates therein in sequence consistent order without further communications from the primary site, and wherein the primary data mover's issued validation order causes primary and secondary check codes to be generated for the portion of record updates and the corresponding shadowed record updates, respectively, and comparing the primary and secondary check codes for copy validation.

12. The data shadowing system according to claim 11 wherein the primary check codes are generated by the primary data mover.

13. The data shadowing system according to claim 11 wherein the primary check codes are generated by the primary storage controllers.

14. The data shadowing system according to claim 11 wherein the primary check codes are generated by the primary storage devices.

15. The data shadowing system according to claim 11 wherein the primary and secondary check codes are cyclic redundancy codes.

16. The data shadowing system according to claim 11 wherein the primary data mover transmits the portion of record updates to the secondary site as a single transmission.

17. The data shadowing system according to claim 16 wherein the secondary site forms a consistency group including the transmitted portion of record updates.

18. The data shadowing system according to claim 17 wherein the primary data mover creates a state table journaling record updates and cross referencing a storage location of each record update on the primary site and the secondary site.

19. The remote data shadowing system according to claim 11 wherein the plurality of primary storage devices are direct access storage devices (DASDs).

20. The data shadowing system according to claim 19 further comprising:

a bit map coupled to the direct access storage devices; and a sidefile coupled to the direct access storage devices for storing a copy of each record update read by the primary data mover for ensuring that an unmodified record update of the portion of record updates is available for generating check codes even though subsequent changes are made to those record updates.

21. An asynchronous remote data duplexing system providing storage based, realtime data shadowing with real time copy-audit validation, including a primary site running applications generating record updates and having a secondary site, remote from the primary site, the secondary site shadowing the record updates and providing disaster recovery for the primary site, the asynchronous remote data duplexing system comprising:

a primary processor at the primary site for running the applications and issuing write I/O operations for corresponding record updates, the primary processor having a primary data mover therein;

a plurality of primary storage controllers receiving the write I/O operation for each record update, each primary storage controller write I/O operation synchronized by the primary processor;

a plurality of primary storage devices storing the record updates therein according to each corresponding write I/O operation, wherein the primary data mover collects record set information from the plurality of primary storage controllers for each record update and appends a prefix header to a predetermined group of record set informations, the prefix header and predetermined record set information groups forming self describing record sets, the primary data mover periodically issuing a validation order to the plurality of primary storage controllers and to the secondary site, each validation order including a copy start time such that record updates falling within consecutive copy start times form a portion of record updates, the primary data mover causing a check code to be generated from each portion of record updates for copy validation;

a secondary processor at the secondary site having a secondary data mover, the secondary data mover receiving the self describing record sets, the validation orders, and the copy start times from the primary site;

a plurality of secondary storage controllers coupled to the secondary processor; and a plurality of secondary storage devices storing the record updates, wherein the secondary data mover determines whether the transmitted self describing record sets are complete and forms secondary portions of record updates from the self describing record sets and copy start times and further provides the record updates from the secondary portion of record updates to the plurality of secondary storage controllers for writing to the plurality of secondary storage devices in an order consistent with a sequence that the record updates were written to the plurality of primary storage devices, the secondary data mover causing a secondary check code to be generated from each secondary portion of record updates, and transmitting the secondary check code to the primary data mover, wherein the primary data mover compares the corresponding primary and secondary check codes to determine whether each secondary portion of record updates is a valid copy of the portion of record updates.

22. A method for validating whether shadowed data is a true copy of primary data updates, wherein the primary data updates are generated by one or more applications running in a primary processor at a primary site, the primary data updates received by a primary storage subsystem, each primary data update identified by a unique device and subsystem address, the primary storage subsystem causing I/O write operations to write each primary data update therein, and wherein a secondary site, whether local to or remote from the primary site, shadows the primary data updates in sequence consistent order such that the secondary site is available for disaster recovery purposes, the method comprising steps of:

(a) operating the primary and secondary sites in a full duplex mode such that the primary data updates are continuously shadowed at the secondary site;

(b) initiating a validation session in the primary and secondary sites, including identifying those primary data updates to be validated as properly shadowed at the secondary site;

(c) determining device and subsystem addresses for the identified primary data updates;

(d) specifying a copy start time for grouping a portion of the identified primary data updates to be validated, the copy start time being a logically equivalent time at the primary and secondary sites for the grouped portion of the identified primary data updates and the corresponding shadowed data at the secondary site;

(e) providing a copy of the grouped portion of primary data updates, and the corresponding shadowed data; and (f) comparing the copies of the grouped portion of primary data updates, and the corresponding shadowed data for determining whether the shadowed data is a true copy of the corresponding primary data updates.

* * * * *